United States Patent
Sakajiri et al.

(10) Patent No.: US 9,717,144 B2
(45) Date of Patent: Jul. 25, 2017

(54) ELECTROCONDUCTIVE NANOWIRE NETWORK, AND ELECTROCONDUCTIVE SUBSTRATE AND TRANSPARENT ELECTRODE USING SAME, AND METHOD FOR MANUFACTURING ELECTROCONDUCTIVE NANOWIRE NETWORK, ELECTROCONDUCTIVE SUBSTRATE, AND TRANSPARENT ELECTRODE

(71) Applicants: Tokyo Institute of Technology, Meguro-ku, Tokyo (JP); JX Nippon Oil & Energy Corporation, Chiyoda-ku, Tokyo (JP)

(72) Inventors: Koichi Sakajiri, Tokyo (JP); Keisuke Azuma, Tokyo (JP); Hidetoshi Matsumoto, Tokyo (JP); Junji Watanabe, Tokyo (JP); Masatoshi Tokita, Tokyo (JP)

(73) Assignees: Tokyo Institute of Technology, Tokyo (JP); JX Nippon Oil & Energy Corporation, Tokyo (JP)

( * ) Notice: Subject to any disclaimer, the term of this patent is extended or adjusted under 35 U.S.C. 154(b) by 0 days.

(21) Appl. No.: 14/768,800

(22) PCT Filed: Feb. 19, 2014

(86) PCT No.: PCT/JP2014/053931
§ 371 (c)(1),
(2) Date: Aug. 19, 2015

(87) PCT Pub. No.: WO2014/129504
PCT Pub. Date: Aug. 28, 2014

(65) Prior Publication Data
US 2016/0007456 A1  Jan. 7, 2016

(30) Foreign Application Priority Data

Feb. 20, 2013 (JP) .................. 2013-031003

(51) Int. Cl.
*H05K 1/09* (2006.01)
*H05K 3/02* (2006.01)
(Continued)

(52) U.S. Cl.
CPC ............ *H05K 1/097* (2013.01); *G06F 3/041* (2013.01); *H01B 1/023* (2013.01);
(Continued)

(58) Field of Classification Search
CPC ........ H05K 1/0274; H05K 3/12; H05K 3/381; H05K 3/386; H05K 1/02; H05K 3/38; G03F 1/54; H01B 13/00
(Continued)

(56) References Cited

U.S. PATENT DOCUMENTS 8,795,462 B2    8/2014 Garbar et al.
8,846,199 B2 *  9/2014 Hellring ................ D01D 5/003
                                              428/297.4
(Continued)

FOREIGN PATENT DOCUMENTS

CN       101040067 A     9/2007
CN       102763171 A    10/2012
(Continued)

OTHER PUBLICATIONS

Electrospun Metal Nanofiber Webs as High-Performance Transparent Electrode Hui Wu et al. Published on Web: Aug. 25, 2010.*

*Primary Examiner* — Michael F McAllister
(74) *Attorney, Agent, or Firm* — Foley & Lardner LLP

(57) ABSTRACT

There are provided a conductive nanowire network, a conductive board and transparent electrode utilizing it, and a
(Continued)

method for producing the same. The conductive nanowire network of the invention has essentially unbroken, continuous conductive nanowires randomly formed into a network. In the method for producing a conductive nanowire network according to the invention, nanofibers are applied in a random network-like fashion onto a substrate covered with a conductive layer, the conductive layer regions that are not covered with the nanofibers are removed, and then the nanofibers are removed. The network structure (wire diameter and network density) are also controlled to obtain a transparent electrode exhibiting both transparency and conductivity.

7 Claims, 1 Drawing Sheet

(51) Int. Cl.
G06F 3/041 (2006.01)
H01L 31/0224 (2006.01)
H01B 1/02 (2006.01)
G02F 1/1343 (2006.01)

(52) U.S. Cl.
CPC ....... H01L 31/022466 (2013.01); H05K 3/02 (2013.01); *G02F 1/13439* (2013.01); *H05K 2201/05* (2013.01)

(58) Field of Classification Search
USPC ...................................... 174/254
See application file for complete search history.

(56) References Cited

U.S. PATENT DOCUMENTS

| | | | |
|---|---|---|---|
| 2007/0075462 A1* | 4/2007 | Coughlin | C01G 19/00 264/465 |
| 2008/0000873 A1 | 1/2008 | Mazzara et al. | |
| 2008/0259262 A1 | 10/2008 | Jones et al. | |
| 2010/0197068 A1 | 8/2010 | Poon et al. | |
| 2011/0003141 A1 | 1/2011 | Garbar | |
| 2011/0253668 A1 | 10/2011 | Winoto et al. | |
| 2012/0061124 A1* | 3/2012 | Cui | B82Y 20/00 174/128.1 |
| 2012/0153236 A1 | 6/2012 | Cakmak et al. | |
| 2013/0050103 A1* | 2/2013 | Song | G06F 3/041 345/173 |
| 2013/0062796 A1* | 3/2013 | Coughlin | B29D 11/00346 264/1.7 |

FOREIGN PATENT DOCUMENTS

| | | |
|---|---|---|
| JP | 2004-223693 A | 8/2004 |
| JP | 2010-003611 A | 1/2010 |
| JP | 2011-086413 A | 4/2011 |
| JP | 2011-515003 A | 5/2011 |
| WO | WO 2009/035059 A1 | 3/2009 |
| WO | WO 2011/088323 A2 | 7/2011 |

* cited by examiner

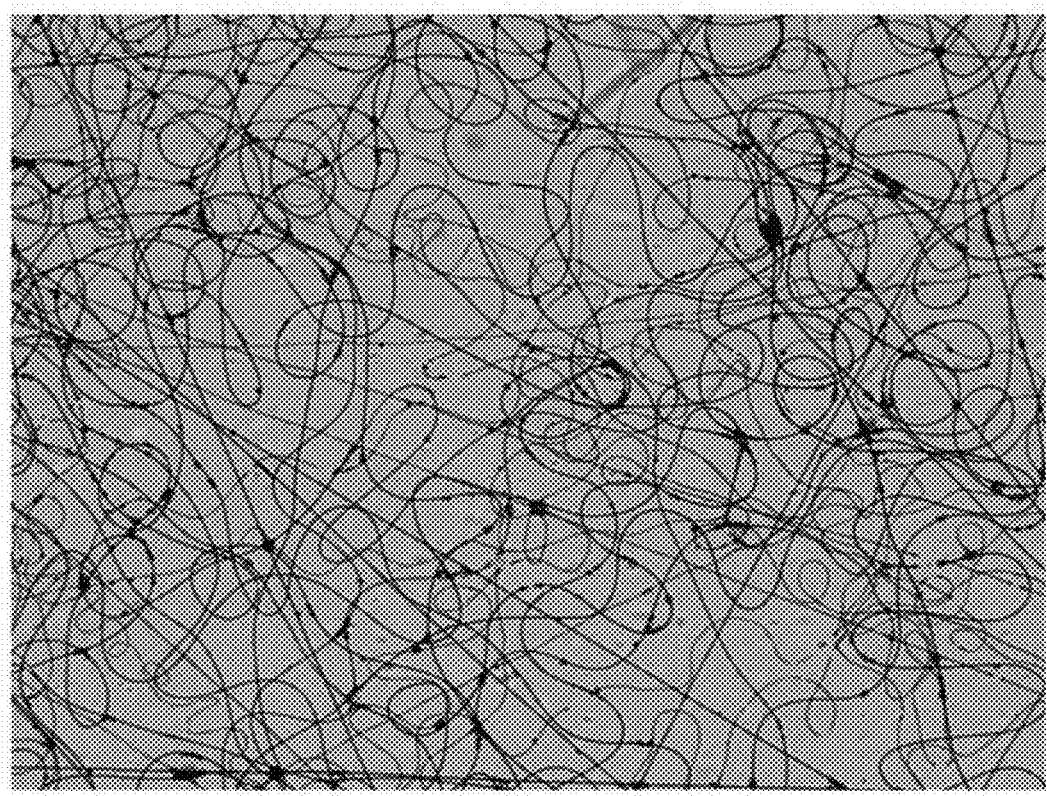

ELECTROCONDUCTIVE NANOWIRE NETWORK, AND ELECTROCONDUCTIVE SUBSTRATE AND TRANSPARENT ELECTRODE USING SAME, AND METHOD FOR MANUFACTURING ELECTROCONDUCTIVE NANOWIRE NETWORK, ELECTROCONDUCTIVE SUBSTRATE, AND TRANSPARENT ELECTRODE

CROSS-REFERENCE TO RELATED APPLICATIONS

This application is a National Stage application of PCT/JP2014/053931, filed Feb. 19, 2014, which claims priority from Japanese application JP 2013-031003, filed Feb. 20, 2013.

TECHNICAL FIELD

The present invention relates to a conductive nanowire network that utilizes nanofibers. The invention further relates to a conductive board and a transparent electrode utilizing the conductive nanowire network, which may be suitably used in electronic devices. The invention further relates to a method for producing the conductive nanowire network, the conductive board and the transparent electrode.

BACKGROUND ART

Transparent electrodes are indispensable elements in display devices such as thin-screen televisions, cellular phones, smartphones and tablets, as well as in touch panels, solar cells, electroluminescent elements, electromagnetic shieldings, functional glass and the like. The primary conducting material for transparent electrodes used in such electronic devices is indium tin oxide (hereunder abbreviated as "ITO").

However, because the indium starting material for ITO is a rare metal, there are concerns with regard to future supply. Furthermore, it has been difficult to reduce costs due to the low productivity in steps such as sputtering for fabrication of ITO films, and a substitute material for ITO has therefore been desired.

New transparent conductive materials that can serve as ITO substitutes have been proposed in recent years, such as transparent conductors with patterned conductive layers that contain metal nanowire materials as well as methods for producing them, as described in Patent Literature 1, for example. Transparent conductive films with transparent conductive layers containing fibrous conductive substances, such as carbon nanotubes or conductive polymers, have also been studied and are described in Patent Literature 2, for example.

These exhibit high transparency and low electrical resistance on a level that can substitute for conventional ITO films, but with transparent conductive films having transparent conductive layers that employ fibrous conductive substances such as metal nanowires or carbon nanotubes, the fibrous conductive substance is in the form of rod-like shapes with limited lengths, and therefore the fibrous conductive substance tends to align in a certain direction during the production steps, readily resulting in anisotropy of the electrical characteristics or optical characteristics of the transparent conductive film. As a result, the electrical characteristics and optical characteristics differ depending on the location and orientation of the transparent conductive film, thus potentially adding the problem of visibility to the other difficulties in terms of quality control. In addition, because of the limited lengths, there are few points of contact between the fibrous conductive substance, i.e. few conductive paths, and it is not possible to adequately exhibit the electrical characteristics of the fibrous conductive substance.

In order to eliminate the anisotropy of properties in transparent conductive films, as represented by Patent Literatures 1 and 2, research has been conducted on transparent conductive films wherein a regular conductive metal mesh pattern is formed to avoid producing anisotropy in the characteristics of the transparent conductive film (Patent Literature 3). However, due to the regularity of the conductive metal mesh pattern, an inherent problem is faced in the tendency toward moire pattern formation.

CITATION LIST

Patent Literature

[Patent Literature 1] Japanese Unexamined Patent Publication No. 2009-505358
[Patent Literature 2] Japanese Unexamined Patent Publication No. 2011-168421
[Patent Literature 3] Japanese Unexamined Patent Publication No. 2006-352073

DISCLOSURE OF THE INVENTION

Problems to be Solved by the Invention

It is an object of the present invention to solve all of these problems at once by providing a conductive nanowire network that can be suitably used in electronic devices, as well as a conductive board and transparent electrode utilizing the conductive nanowire network, at low cost by a simple process.

Means for Solving the Problems

As a result of much devoted research with the aim of solving the problems mentioned above, the present inventors have found when essentially unbroken, continuous nanofibers are applied in a random network-like fashion onto a substrate covered with a conductive layer, and the conductive layer regions that are not covered by the nanofibers are removed and then the nanofibers are removed, it is possible to obtain a network-like electric conductor, i.e., a conductive nanowire network in which essentially unbroken, continuous conductive nanowires form a random network, and further that if the network structure (the wire diameter and network density) is controlled, it is possible to obtain a transparent electrode exhibiting both transparency and conductivity, and the invention has thereupon been completed.

Effect of the Invention

Since the present invention utilizes a random network of essentially unbroken, continuous nanofibers, the obtained conductive nanowire network is isotropic, and a transparent electrode utilizing the conductive nanowire network exhibits stable property values and produces no moire pattern. Moreover, compared to conventional nanowires that have been restricted in their lengths (having limited lengths), the nanowires of the invention have numerous contact points between the wires, and a network with low electrical resistance can thus be obtained. It is thus possible to reduce the amount of nanowires (i.e., the network density) required to achieve the same conductivity, thereby allowing higher transparency to be obtained. It is therefore possible to provide a transparent electrode utilizing a conductive nanowire network that can be suitably used in electronic devices. Furthermore, since common polymer materials can be used as the nanofiber starting materials in a simple process, the cost is reduced. In addition, since the transparent electrode of the invention can employ a substrate with excellent bending resistance, it can be satisfactorily used in flexible electronic devices that require bending resistance, such as in transparent conductive films for touch panels, transparent electrodes for electronic paper, transparent electrodes for flexible thin-film solar cells and transparent electrodes for flexible displays.

BRIEF DESCRIPTION OF THE DRAWINGS

FIG. 1 is an example of a photomicrograph of a conductive nanowire network of the invention.

BEST MODE FOR CARRYING OUT THE INVENTION

The present invention will now be explained in greater detail.

(Conductive Nanowire Network)

The conductive nanowire network of the invention is an electric conductor of essentially unbroken, continuous conductive nanowires randomly formed into a network. The usage of the term "electric conductor" through the present specification denotes not only the conductive nanowire network itself, but also the board and other members supporting the network. In the conductive nanowire network of the invention, a form in which essentially unbroken, continuous nanowires are forming a random network does not include a network with constant regularity, i.e., a form of a grid-like pattern or the like composed of a specific pattern or a combination of specific patterns of, for example, n-polygons such as triangles, quadrilaterals or hexagons, or circles, ellipses or the like, or any combination thereof. Naturally, the conductive nanowire network of the invention need only have an irregular configuration as a whole, and may include local regularly shaped network sections that occur by chance, as long as the desired effect is achieved. As an example, the conductive nanowire network of the invention can be obtained by using appropriate means to apply the network-like nanofibers onto a substrate covered with a conductive layer, removing the conductive layer regions that are not covered with the nanofibers, and then removing the network-like nanofibers. Because the lengths of conventional fibrous conductive substances such as metal nanowires or carbon nanotubes are limited, transparent conductive films with transparent conductive layers employing them have tended to have the fibrous conductive substances become oriented in a certain direction during the production process, resulting in problems such as anisotropy of the electrical characteristics and optical characteristics of the transparent conductive film, whereas the conductive nanowire network of the invention comprises an essentially unbroken, continuous random network electric conductor, and therefore has essentially no anisotropy and no regularity of the network, so that essentially no moire pattern forms. Furthermore, it is possible to easily control the density of the network, allowing both satisfactory light transmittance and conductivity to be obtained that are suitable for particular purposes. The "nanofibers" forming the conductive nanowire network of the invention may consist of a single continuous nanofiber, or a plurality of independent nanofibers. In either case, it is important for each of the nanofibers to have sufficient lengths so as to create numerous contact points between the wires when they are randomly applied onto the substrate.

The conductive layer may be a metal compound, examples of which include metals such as iron, cobalt, nickel, copper, zinc, chromium, molybdenum, ruthenium, rhodium, palladium, silver, cadmium, osmium, iridium, platinum, gold and aluminum and their metal alloys, or metal oxides such as ITO, indium gallium zinc oxide (IGZO), titanium oxide, cobalt oxide, zinc oxide, vanadium oxide, indium oxide, aluminum oxide, nickel oxide, tin oxide, tantalum oxide, niobium oxide, vanadium oxide and zirconium oxide, and metal nitrides such as titanium nitride, zirconium nitride and aluminum nitride, but the conductive layer of the conductive nanowire network of the invention is not limited to these, and any conductive substance may be employed. For provision of a transparent electrode utilizing a conductive nanowire network of the invention, copper, silver, aluminum and indium tin oxide are preferred from the viewpoint of conductivity, and for provision of a flexible transparent electrode (transparent conductive film), metals such as aluminum and copper or their alloys are preferred, with aluminum being more preferred from the viewpoint of lightweight and cost reduction.

A substrate for the conductive layer may be made of resin, glass or the like, with no particular restrictions so long as it is not damaged during the subsequent conductive layer removal step as described later, and the material, shape, construction, thickness, etc. may be appropriately selected from among publicly known parameters. Resins include polyesters such as polyethylene terephthalate and polyethylene naphthalate, liquid crystalline aromatic polyesters, liquid crystalline fully aromatic polyesters, polycarbonates, polyacrylic acid esters such as polymethyl acrylate and polyethyl acrylate, polymethacrylates, such as polymethyl methacrylate, polyethyl methacrylate and polyhydroxyethyl methacrylate, polyacrylonitrile, polyethylene, polypropylene, polyolefins, cycloolefin resins, polyvinyl chloride, polystyrene, polylactic acid, aliphatic polyamides, fully aromatic polyamides, polyimides, polyether ether ketone, polynorbornanes, polysulfones, polysulfides, polyparaphenylenebenzobisoxazole, polyurethanes, epoxy resins, saccharide-based polymers such as triacetyl cellulose, fluorine-containing polymers such as polyvinylidene fluoride, silicon-containing polymers such as polysiloxane, polysilsesquioxane and polysilane, phosphorus-containing polymers such as polyphosphazene, acrylonitrile-butadiene-styrene copolymers, and copolymers or mixtures of the foregoing substances. Here, the copolymer may be any copolymer such as a random copolymer, alternating copolymer, block copolymer or graft copolymer, and may even be composed of two or more different components. The glass used may be common soda glass or the like. It may also be a composite substrate, which is a combined substrate of a resin and glass, or a substrate having two or more different types of resin laminated together. The type of substrate is not restricted to the examples mentioned above, and may be selected as optimal in terms of transparency, durability, cost and the like, while the thickness of the substrate is preferably between 1 μm and 2000 μm, inclusive, in consideration of its function as a transparent electrode. For provision of a flexible transparent electrode (transparent conductive film) in particular, among transparent electrodes utilizing the conductive nanowire network of the invention, the preferred examples are polyesters, from the viewpoint of properties such as transparency, dimensional stability, thickness uniformity, strength, heat resistance, chemical resistance and water resistance, although there is no limitation thereto and the selection may be as appropriate for the purpose of use. In this case, the thickness of the substrate must be determined in consideration of pliability and flexibility of the substrate in addition to transparency, and is preferably between 1 μm and 500 μm, inclusive, although this range will depend on the purpose of use and is therefore not exclusive.

The method of fabricating the substrate covered with the conductive layer, i.e., the method of covering the substrate with the conductive substance, may be physical fabrication by sputtering, vacuum vapor deposition, ion plating or the like, chemical fabrication by a spray method, dip method, CVD method or the like, or various plating methods, the method being one that can accomplish uniform coverage suited for the conductive substance that is to cover the substrate. The thickness of the conductive layer may be set as the thickness optimal for the purpose of use, and will depend on the resistance value of the conductive layer that is to cover the substrate, but preferably the thickness is between 1 nm and 500 nm, inclusive.

The nanofibers to be applied onto the substrate covered with the conductive layer may be any type of nanofibers that can be applied in the form of an unbroken, continuous network. However, in the method for producing a conductive nanowire network described above as an example, it is necessary to remove the nanofibers using a solvent or the like during the final step for obtaining the conductive nanowire network, and therefore the material used for the nanofibers should be a different material than that used for the substrate. Nanofibers that may be used include polyesters such as polyethylene terephthalate and polyethylene naphthalate, liquid crystalline aromatic polyesters, liquid crystalline fully aromatic polyesters, polycarbonates, polyacrylic acid esters such as polymethyl acrylate and polyethyl acrylate, polymethacrylates such as polymethyl methacrylate, polyethyl methacrylate and polyhydroxyethyl methacrylate, polyacrylamides, polymethacrylamides, polyacrylonitriles, polyolefins such as polyethylene and polypropylene, cycloolefin resins, polyvinyl chloride, polystyrenes, polylactic acids, aliphatic polyamides, fully aromatic polyamides, polyimides, polyether ether ketone, polynorbornanes, polysulfones, polysulfides, polyparaphenylenebenzobisoxazole, conductive polymers such as polyacetylene, polypyrrole and polythiophene, polyurethanes, epoxy resins, phenol resins, saccharide-based polymers such as cellulose acetate, cellulose nitrate, hydroxypropyl cellulose and chitin/chitosan, hydrophilic polymers such as polyethylene oxide, polyvinyl alcohol and polyvinylpyrrolidone, polypeptides such as polybenzyl glutamate, fluorine-containing polymers such as polyvinylidene fluoride, silicon-containing polymers such as polysiloxane, polysilsesquioxane and polysilane, phosphorus-containing polymers such as polyphosphazene, acrylonitrile-butadiene-styrene copolymers, and copolymers or mixtures of the foregoing substances. The copolymer may be any copolymer such as a random copolymer, alternating copolymer, block copolymer or graft copolymer, and it may even be composed of two or more different components. As nanofibers there may also be used, for example, supramolecular assembly fibers obtained from supramolecular assembly compounds that self-assemble by non-covalent bond interactions with low molecular compounds such as tricarboxamide.

The method of applying the nanofibers onto the substrate covered with the conductive layer may be a method of direct deposition by a spinning process such as electrospinning, conjugate melt spinning, melt blowing or the like, a method in which nanofibers that have been prespun by an appropriate method are dispersed onto the substrate, a method in which nanofibers that have been prewoven into a network form are attached to the substrate, or a method in which a gel or similar form of the polymer or supramolecular assembly that is to form the network, is spin coated onto the substrate, there being no limitation to these methods, and any desired appropriate method may be employed so long as it does not damage the substrate that is coated with the conductive layer. Particularly preferred is an electrospinning method, since it allows spinning at ordinary temperature and permits easy control of the nanofiber diameters and network density. The method of controlling the nanofiber diameters and density by electrospinning may be control of the nanofiber diameters by adjustment of the viscosity, electric conductivity, surface tension, solvent boiling point and other physical properties of the spinning solution, and the process conditions including the applied voltage, the distance between the nozzle and substrate, and the solution supply rate. Of these control factors, adjustment of the spinning solution viscosity and electric conductivity are most commonly used as methods of control. Specifically, the spinning solution viscosity can be controlled by adjusting the molecular weight and concentration of the solute molecules (polymer or sol/gel precursor) in the spinning solution, and the temperature of the spinning solution, while the electric conductivity of the spinning solution can be controlled by adding an electrolyte to the spinning solution. Generally speaking, the diameters of the nanofibers can be narrowed with a higher molecular weight and lower concentration of solute molecules in the spinning solution, and a greater electric conductivity of the spinning solution in a range that does not interfere with charge induction in a high electric field. Selection may be as appropriate for the use in terms of the molecular weight and concentration of the solute molecules, as long as the spinning solution can be prepared in a uniform manner. The electrolyte may be an organic solvent such as pyridine, acetic acid or an amine, or an inorganic salt such as a lithium salt, sodium salt, potassium salt or carbonic acid salt. There are no particular restrictions to these as long as a uniform spinning solution can be prepared. The nanofiber density can be easily adjusted by controlling the electrospinning time. The nanofiber density will increase with a longer electrospinning time, but since the electrospinning time depends on the type and concentration of the electrospinning solution, as well as on the apparatus used, it cannot be specified for all cases and is not particularly restricted, and may be appropriately selected according to the purpose of use.

The diameters of the nanofibers to be applied onto the substrate covered with the conductive layer will depend on the resistance value of the conductive layer and the manner of usage, but the mean diameter is preferably no greater than 5000 nm, and if reduction in transparency due to light scattering is a particular concern, it is more preferably no greater than 2000 nm and even more preferably no greater than 1000 nm.

The applied nanofibers function as a mask for the conductive layer and must therefore be firmly bonded to the conductive layer. If the bonding is insufficient, defects such as wire breakage may be produced in the obtained conductive nanowire network, potentially lowering the conductivity. As the method for increasing the adhesiveness of the applied nanofibers for the conductive layer, for example, heat treatment may be carried out at above the glass transition temperature of the nanofibers. The heat treatment temperature and heat treatment time will depend on the thermal properties and viscosity of the substrate and nanofibers, and for example, it is preferably 1 minute or longer at 200° C., while from the viewpoint of preventing heat degradation it is preferably no longer than 200 minutes.

The method for removing the conductive layer regions that are not covered with the nanofibers will depend on the physical properties of the conductive substance forming the conductive layer, and for example, it may be a wet method that involves dipping in an acidic aqueous solution of hydrochloric acid, nitric acid or the like, or an aqueous solution of sodium hydroxide or potassium hydroxide, and ionization or complex ionization of the conductive substance for dissolution in the aqueous solution. The dipping time and temperature may be appropriately selected according to the type and concentration of the aqueous solution and the type and thickness of the conductive layer to be dissolved, or if necessary there may instead be used a dry method using an organic gas or halogen-based gas.

After the conductive layer regions that are not covered by the nanofibers have been removed, the substrate containing the conductive network covered with the nanofibers is preferably thoroughly rinsed with water or the like to remove the impurities, such as the compounds resulting from ionization or complex ionization of the conductive substance and the solute in the aqueous solution.

Next, the network-like nanofibers may be removed to obtain a conductive nanowire network reflecting the random trail of the network-like nanofibers. The method of removing the network-like nanofibers requires selection of a suitable solvent with appropriate consideration of the solubility of the nanofibers used and the solubility of the substrate conductive layer. Specifically, a solvent that can dissolve the nanofibers and that does not dissolve the substrate and conductive layer is appropriately selected, for dissolution and removal of the nanofibers.

(Transparent Electrode Utilizing Conductive Nanowire Network)

A transparent electrode utilizing a conductive nanowire network of the invention is obtained by optimizing the density of the conductive nanowire network according to the intended use, and it is a transparent electrode using a rigid substrate such as glass or a transparent electrode using a flexible substrate such as a resin (transparent conductive film). For suitable use as a transparent electrode, it preferably has transparency such that the light transmittance in the visible light region (about 400 nm to 700 nm) is 50% or greater and more preferably 70% or greater, although this will depend on the purpose of use. The surface electric resistivity will also depend on the purpose of use, but it is preferably 1000 Ω/sq. or lower and more preferably 500 Ω/sq. or lower. A transparent electrode utilizing a conductive nanowire network of the invention may be obtained, for example, by combining various different substrates, conductive layers and nanofibers as described above, and therefore restrictions cannot be placed on the individual conditions, but satisfactory usage is possible by appropriately setting the type and thickness of the substrate, the type and thickness of the conductive layer, the nanofiber diameter and the network density, in ranges that do not result in loss of function of the transparent electrode. Furthermore, a transparent electrode utilizing a conductive nanowire network of the invention has no regularity in the network and hence produces essentially no moire pattern.

EXAMPLES

The present invention will now be described in greater detail by examples, with the understanding that the invention is not limited in any way by the examples, and it may include various appropriate modifications such as are within the gist of the invention as laid out in the claims. The different physical properties of the conductive nanowire networks described in the examples were measured by the following methods.

<Mean Diameter>

The diameter was measured at 50 randomly chosen locations using a scanning electron microscope (JCM-5700 by JEOL), and the mean value was calculated.

<Transmittance>

The transmittance from 400 nm to 700 nm was measured using a visible-ultraviolet spectrophotometer (V-570 by JASCO Corp.). The resin film used as the substrate was subtracted as background, and the transmittance at 550 nm was recorded as the transmittance of the conductive nanowire network.

<Surface Resistivity>

The transparent conductive film was cut to 5 cm square and used as a measuring sample. Upon selecting 10 random locations, a four-terminal probe resistivity meter (LORESTA Model EP MCP-T360 by Mitsubishi Chemical Corp.) was used, measuring the surface resistivity while contacting the four-terminal probe, and recording the average of the 10 locations as the surface resistivity.

Example 1

As the substrate there was used 25 μm-thick polyethylene terephthalate covered with aluminum to a thickness of 100 nm as the conductive layer, and a 1 mL-volume syringe was used for electrospinning with an inter-electrode distance of 10 cm, a difference in potential of 15 kV and a delivery rate of 3.33 μL/min (DC high-voltage power supply: HAR-100P 0.3 by Matsusada Precision, Inc., syringe pump: MCIP-III by Minato Concept, Inc.), depositing nanofibers of polymethyl methacrylate (weight-average molecular weight: 91500) (product of Wako Pure Chemical Industries, Ltd.) onto the substrate for 5 seconds. The mean fiber size of the obtained fibers was 600 nm. The electrospinning solution of polymethyl methacrylate used was a 25 wt % concentration solution of DMF (N',N'-dimethylformamide) (Wako Pure Chemical Industries, Ltd.). Next, the polyethylene terephthalate substrate including the aluminum conductive layer on which the nanofibers had been deposited was subjected to heat treatment at 200° C. for 1 minute in order to have the nanofibers adhere to the aluminum conductive layer. As a result, the mean fiber size increased to 1200 nm. Next, the polyethylene terephthalate substrate including the aluminum conductive layer on which the nanofibers had been deposited was dipped for 2 minutes in a 1M potassium hydroxide aqueous solution at ordinary temperature, dissolving off the aluminum component that was not covered with the nanofibers, and it was rinsed with water. Finally, the nanofibers were dissolved off with acetone, to obtain an unbroken, continuous random conductive nanowire network (average width: 1150 nm). As a result of evaluation as a transparent electrode, the transmittance was 78% and the surface resistivity was 51 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

Example 2

Using polyethylene terephthalate with an aluminum conductive layer, similar to Example 1, as the substrate, a 1 mL-volume syringe was used for deposition of polystyrene (weight-average molecular weight: 23,000,000) nanofibers on the substrate for 3 minutes, by electrospinning with an inter-electrode distance of 15 cm, a difference in potential of 4.5 kV and a delivery rate of 5 µL/min. The mean fiber size of the obtained fibers was 300 nm. The polystyrene electrospinning solution used was a 0.20 wt % concentration DMF/tetrahydrofuran (1:1 mass ratio) solution. Next, the polyethylene terephthalate substrate including the aluminum conductive layer on which the nanofibers had been deposited was subjected to heat treatment at 200° C. for 30 minutes in order to have the nanofibers adhere to the aluminum conductive layer. As a result, the mean fiber size increased to 600 nm. Next, the polyethylene terephthalate substrate including the aluminum conductive layer on which the nanofibers had been deposited was dipped for 3 minutes in a 1M sodium hydroxide aqueous solution at ordinary temperature, dissolving off the aluminum component that was not covered with the nanofibers, and it was rinsed with water. Finally, the nanofibers were dissolved off with chloroform in order to obtain an unbroken, continuous random conductive nanowire network (average width: 600 nm). As a result of evaluation as a transparent electrode, the transmittance was 80% and the surface resistivity was 62 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

Example 3

An unbroken, continuous random conductive nanowire network was obtained in the same manner as Example 2. However, the polystyrene concentration was 0.25 wt %. Also, the mean fiber size of the obtained fibers was 300 nm. The mean fiber size of the fibers and the average width of the nanowires after heat treatment was 600 nm. As a result of evaluation as a transparent electrode, the transmittance was 76% and the surface resistivity was 45 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

FIG. 1 shows a photomicrograph of the obtained conductive nanowire network. In the drawing there can be seen the random formation of a network of unbroken, continuous nanofibers.

Example 4

An unbroken, continuous random conductive nanowire network was obtained in the same manner as Example 3. However, the deposition time of the nanofibers by electrospinning was 1 minute. The mean fiber size of the obtained fibers was 300 nm. The mean fiber size of the fibers and the average width of the nanowires after heat treatment was 600 nm. As a result of evaluation as a transparent electrode, the transmittance was 93% and the surface resistivity was 125 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

Example 5

An unbroken, continuous random conductive nanowire network was obtained in the same manner as Example 3. However, the deposition time of the nanofibers by electrospinning was 5 minutes. The mean fiber size of the obtained fibers was 300 nm. The mean fiber size of the fibers and the average width of the nanowires after heat treatment was 600 nm. As a result of evaluation as a transparent electrode, the transmittance was 68% and the surface resistivity was 24 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

Example 6

An unbroken, continuous random conductive nanowire network was obtained in the same manner as Example 2. However, the polystyrene concentration was 0.98 wt %. Also, the mean fiber size of the obtained fibers was 750 nm. The mean fiber size of the fibers and the width of the nanowires after heat treatment was 1500 nm. As a result of evaluation as a transparent electrode, the transmittance was 35% and the surface resistivity was 6 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

Example 7

An unbroken, continuous random conductive nanowire network was obtained in the same manner as Example 6. However, the deposition time of the nanofibers by electrospinning was 1 minute. The mean fiber size of the obtained fibers was 750 nm. The mean fiber size of the fibers and the average width of the nanowires after heat treatment was 1500 nm. As a result of evaluation as a transparent electrode, the transmittance was 64% and the surface resistivity was 27 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

Example 8

An unbroken, continuous random conductive nanowire network was obtained in the same manner as Example 6. However, the deposition time of the nanofibers by electrospinning was 0.5 minute. The mean fiber size of the obtained fibers was 750 nm. The mean fiber size of the fibers and the average width of the nanowires after heat treatment was 1500 nm. As a result of evaluation as a transparent electrode, the transmittance was 77% and the surface resistivity was 76 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

Example 9

An unbroken, continuous random conductive nanowire network was obtained in the same manner as Example 2. However, the deposition time of the nanofibers by electrospinning was 2 minutes. Also, the polystyrene electrospinning solution used was a 0.05 wt % concentration DMF/tetrahydrofuran (1:3 mass ratio) solution. The heat treatment temperature was 160° C. The mean fiber size of the obtained fibers was 170 nm. The mean fiber size of the fibers and the average width of the nanowires after heat treatment was 300 nm. As a result of evaluation as a transparent electrode, the transmittance was 84% and the surface resistivity was 109 Ω/sq. Also, the obtained conductive nanowire network exhibited flexibility by which it flexibly followed the shape of the polyethylene terephthalate substrate. Furthermore, no perceptible moire pattern was produced in the obtained transparent electrode.

As demonstrated by the results for these examples, there has been invented an unbroken, continuous random conductive nanowire network that does not exist in the prior art, and it is useful to utilize it as a transparent electrode.

INDUSTRIAL APPLICABILITY

The present invention provides an unbroken, continuous random conductive nanowire network that is not found in the prior art, as well as a conductive board and transparent electrode utilizing the conductive nanowire network, at low cost with a simple process, which are suitable for use in electronic devices such as display devices and touch panels. They are also highly useful for flexible electronic devices that particularly require bending resistance.

What is claimed is:

1. A conductive board comprising a substrate having supported thereon a conductive nanowire, the conductive nanowire comprising aluminum, the conductive nanowire comprising an essentially unbroken, continuous conductive nanowire randomly formed into a network, wherein the conductive board has a light transmittance in the visible light region of 50% or greater, and a surface electric resistivity of 500 Ω/sq or lower.

2. A conductive board according to claim 1, wherein the substrate is transparent.

3. A conductive board according to claim 1, wherein the substrate comprises a flexible resin.

4. A conductive board according to claim 1, wherein the conductive board comprises a transparent electrode.

5. A conductive board according to claim 1, wherein said conductive board is obtained by a method comprising:
   a) providing a substrate covered with a conductive layer comprising aluminum,
   b) depositing nanofibers having a mean diameter of no greater than 5000 nm in a random network-like fashion onto the substrate covered with the conductive layer,
   c) subjecting the substrate to heat treatment so as to have the nanofibers adhere to the conductive layer,
   d) removing by dissolution the regions of the conductive layer on the substrate that are not covered with the nanofibers, and
   e) removing from the substrate the nanofibers by dissolution with a solvent to produce the conductive nanowire network.

6. A conductive board according to claim 5, wherein said depositing comprises depositing the nanofibers by electrospinning.

7. A conductive board according to claim 5, further comprising heat treating the nanofibers at a temperature above a glass transition temperature of the nanofibers.

* * * * *